United States Patent [19]

Ichinohe

[11] 4,069,067
[45] Jan. 17, 1978

[54] METHOD OF MAKING A SEMICONDUCTOR DEVICE

[75] Inventor: Eisuke Ichinohe, Katano, Japan

[73] Assignee: Matsushita Electric Industrial Co., Ltd., Kadoma, Japan

[21] Appl. No.: 667,445

[22] Filed: Mar. 16, 1976

[30] Foreign Application Priority Data

| Mar. 20, 1975 | Japan | 50-34179 |
| Mar. 20, 1975 | Japan | 50-34156 |
| Mar. 28, 1975 | Japan | 50-36588 |
| Mar. 28, 1975 | Japan | 50-36589 |
| May 6, 1975 | Japan | 50-54839 |

[51] Int. Cl.² .......................................... H01L 21/26
[52] U.S. Cl. .................................. 148/1.5; 148/187; 148/188
[58] Field of Search ................. 148/187, 188, 1.5

[56] References Cited
U.S. PATENT DOCUMENTS

| 3,664,896 | 5/1972 | Duncan | 148/187 |
| 3,673,679 | 7/1972 | Carbajal et al. | 148/188 X |
| 3,730,778 | 5/1973 | Shannon et al. | 148/187 X |
| 3,771,218 | 11/1973 | Langdon | 148/187 X |
| 3,793,088 | 2/1974 | Eckton, Jr. | 148/187 X |

*Primary Examiner*—G. Ozaki
*Attorney, Agent, or Firm*—Cushman, Darby & Cushman

[57] ABSTRACT

A semiconductor device is described comprising a semiconductor substrate, plural impurity-diffused regions formed in the substrate, an insulation layer formed so as to cover selected parts of the substrate, plural low-resistance semiconductor regions isolated from each other by the insulation layer and at least some of them contacting said diffused regions and conductive regions disposed in a manner to contact said low-resistance semiconductor regions, respectively.

Thus, the low-resistance semiconductor regions serve as connection means between the diffused region and the conductive region, which means serves to uniform contacting level, thereby decreasing the size of the device.

7 Claims, 9 Drawing Figures

FIG. 1 (Prior Art)
(a) 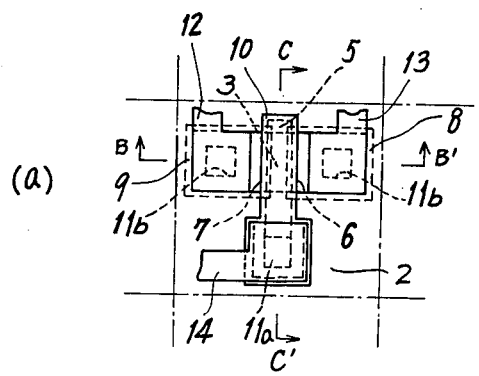
(b) 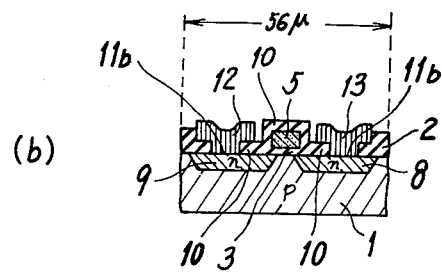
(c) 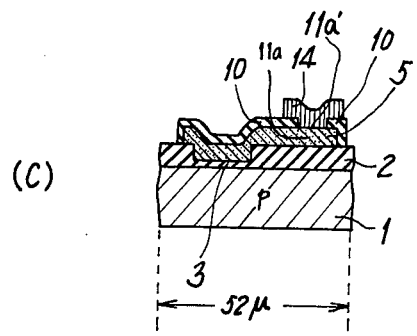

FIG. 6.
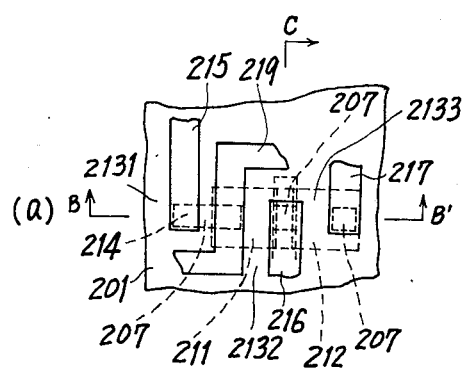
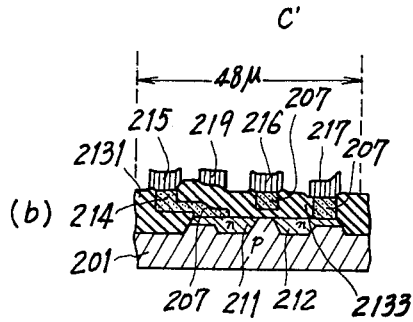
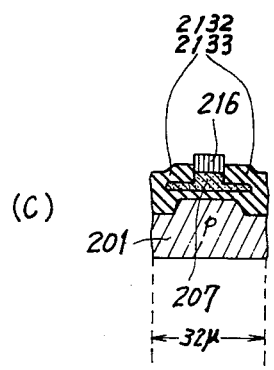
FIG. 7.
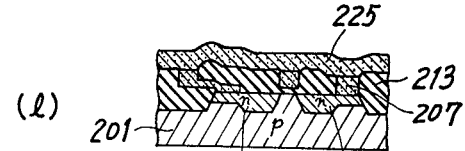
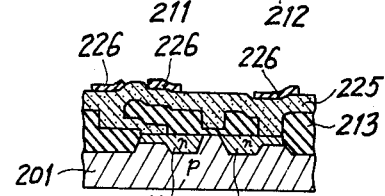
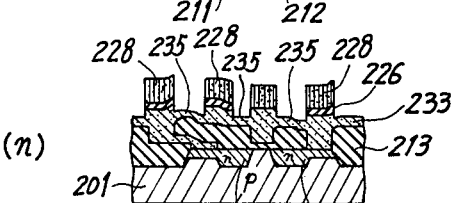
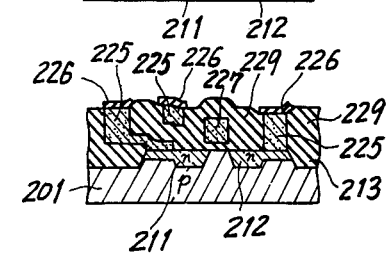
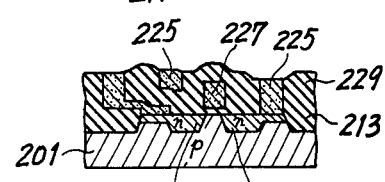
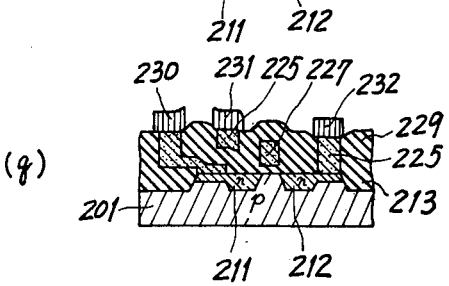

FIG. 8.
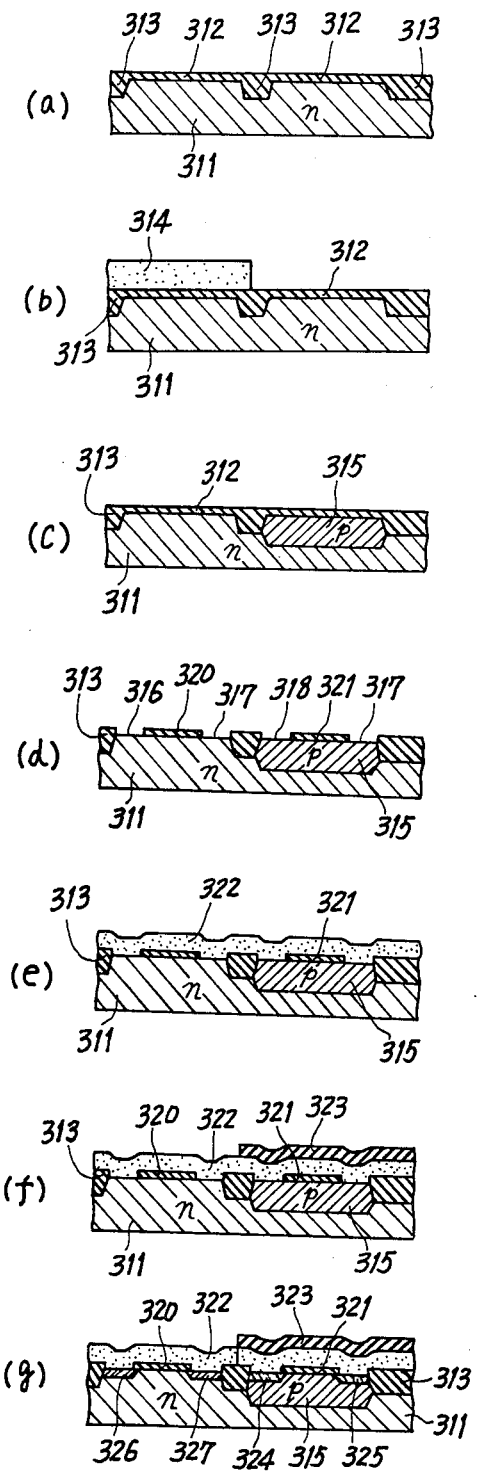
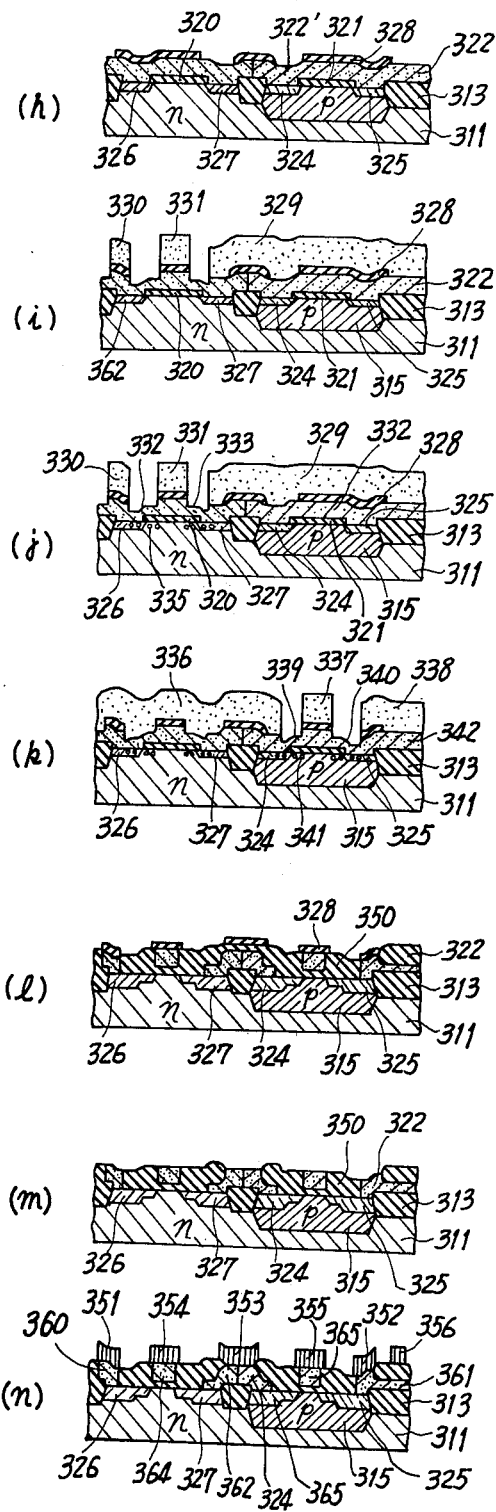

METHOD OF MAKING A SEMICONDUCTOR DEVICE

BACKGROUND OF THE INVENTION

This invention relates to improved semiconductor devices and methods for their manufacture.

More particularly, this invention concerns semiconductor devices having an MOS IC structure with highly-doped low-resistance silicon film parts within a MOS insulation film and methods for manufacturing them.

Previously much research and development concerning MOS structures have been made. Taking as one representative example of such MOS semiconductor device, a silicon-gate MOS transistor is explained now referring to FIG. 1, wherein (a) is a plan view of the MOS transistor, (b) is a sectional front view seen at the sectional plane indicated by the line B–B' in (a), and (c) is a sectional sideview seen at the sectional plane indicated by the line C–C' in (a).

As shown in (a), (b) and (c) of FIG. 1, the MOS transistor is formed by the following steps:

On the semiconductor substrate 1, a thick $SiO_2$ film as a field oxide film 2 and a thin $SiO_2$ film as a gate oxide film 3, are formed by, for instance, the thermal oxidization method;

High-resistance polycrystalline silicon film is formed with a specified pattern so as to form gate region 5 and also cover selected regions;

Utilizing the polycrystalline silicon films as a mask, the part of silicon dioxide film 3, which part is not covered with the polycrystalline film, is etched away to expose the initial surface of the substrate from the windows 6, 7 formed by the etching;

An impurity is diffused through the windows 6, 7 to form the source region 8 and the drain region 9, respectively, and simultaneously, the polycrystalline silicon film 5 of low resistivity.

Thermal oxidation and $SiO_2$ chemical vapor deposition (with $SiH_4$ and $O_2$ flowing on the wafer heated at about 400° – 500° C) form an $SiO_2$ film 10 to cover the polycrystalline silicon films 5 of the gate; and Three windows are formed on the $SiO_2$ film 10, and contacts 12, 13, 14 for the source, the drain and the gate are made therethrough.

The merit of the abovementioned structure and making method is that the source and the drain regions can be formed by the so-called self-aligned diffusion process. However, the device and the method has a problem that, as seen in FIG. 1(c), in forming the contacts 12, 13 and 14 to the device, there occurs a difference in the level of the contacting plane on the polycrystalline silicon film, namely the sum of the thicknesses of the polycrystal silicon region 5 and the gate oxide film 3 to be etched way. Moreover, in forming the $SiO_2$ film 10 on the polycrystalline silicon region 5 by the chemical vapor deposition method, the $SiO_2$ film 10 usually becomes thicker on the region 5 than on other parts such as the field oxide films. This also serves to enhance the level or thickness difference. As a result of the high level differences, when other metallizations for interconnections are formed crosswise of the strip of the Si region 5 on FIG. 1(a), the metallized films tend to become thin at the step-shaped parts formed by the level difference, thereby increasing the possibility of breakdown of the connection. If a measure of thickening the metallization film to be greater than the thickness required to secure firm connections would be taken, the planview pattern of the device must be larger in size. Also, in such a prior art device, it has been necessary to form the diffused regions 8, 9 and the contact region 11a of polycrystalline Si 5 larger than the windows 11b, 11b and 11a in order to secure contact to the regions 8, 9 and 5, in the case of possible derangement of the mask registration. This also leads to an increase of the size of the device.

As has been mentioned above, the device and method of FIG. 1 has a drawback in that high density integration cannot be made on account of its large level differences in the surface structure. Furthermore, when etching the $SiO_2$ films 2 and 10 to form the windows, there are possibilities of decreasing production yield of accidentally formed pin-holes on the CVD (chemically vapor-deposited) $SiO_2$ film or on an etching mask.

SUMMARY OF THE INVENTION

An object of the present invention is to provide a semiconductor device and a method for producing same wherein the area illustrated in the planview of the connections between regions on the low-resistance semiconductor and the metal connectors is decreased, thereby decreasing the size of the unit element of the integrated circuit and hence increasing density of integration.

Another object of the present invention is to provide a semiconductor device wherein plural connection parts between the semiconductors and the metal connectors are formed almost on the same level with each other thereby enabling high-integration of such semiconductor units in an integrated circuit.

BRIEF EXPLANATION OF THE DRAWINGS

FIG. 1 shows a prior art of MOS transistor, wherein (a) is a planview, (b) is a sectional front view seen at the sectional plane indicated by the line B–B' in (a), and (c) is a sectional sideview seen at the sectional plane indicated by the line C–C' in (a), FIG. 4(m) shows a planview of the device shown in FIG. 4(l), FIG. 6 shows the MOS transistor made by the steps shown in FIG. 5, wherein (a) is a planview, (b) is a sectional front view seen at the sectional plane indicated by the line B–B' in (a), and (c) is a sectional sideview seen at the sectional plane indicated by the line C–C' in (a), FIG. 7 shows by sectional front views conducting the steps of a fourth example, forming a fourth MOS transistor, embodying the present invention, and FIG. 8 shows by sectional front views conducting the steps of a fifth example, a complementary MOS FETs, embodying the present invention.

DETAILED DESCRIPTION OF THE INVENTION

The objects of the present invention are attained by the structure that, for example, comprises,
 in a semiconductor substrate (e.g., 21),
 impurity-diffused regions (e.g., 29, 30),
 low-resistance (i.e., highly-doped) semiconductor films (e.g. 25, 25', 32) which are disposed to contact said impurity-diffused regions and are isolated from each other by an insulation film (e.g. 22) and
 metal contacts (e.g. 35, 37, 36) which are disposed to contact the exposed parts of said low-resistance semiconductor films.

Figure 2:
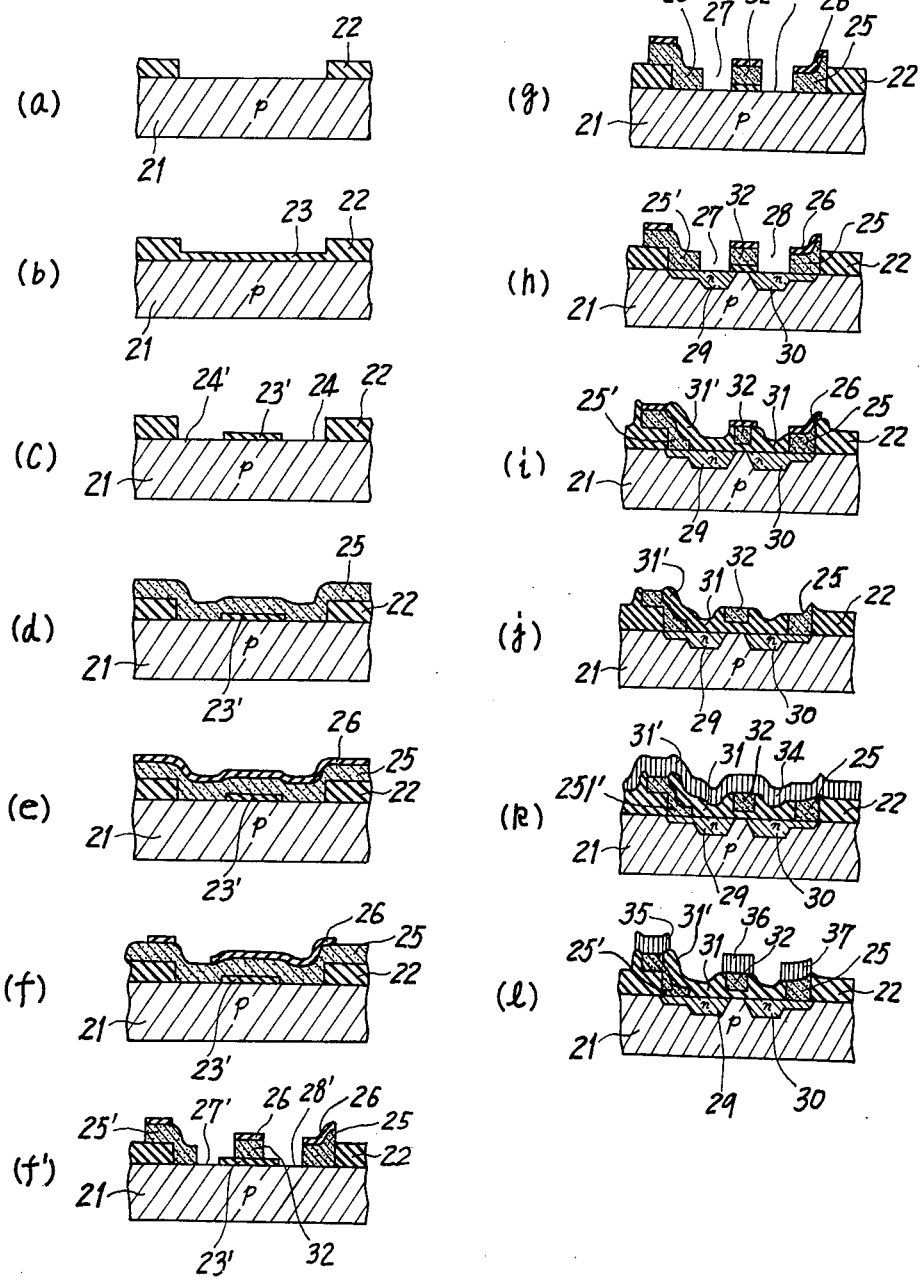
FIG. 2 shows by sectional front views conducting the steps of the first example, forming a first MOS transistor, embodying the present invention.

The abovementioned structure is formed, for example, by the steps of:
 forming an insulation film (e.g. 22, 23' of FIG. 2(c)) having a first pattern,
 forming a low-resistance polycrystalline semiconductor film (e.g. 25 of FIG. 2(d)),
 forming oxidation-resistive film having a second pattern (e.g. 26 of FIG. 2(f)),
 etching selected parts of said oxidation-resistive film 26 and said low-resistance polycrystalline semiconductor film 25 (as shown in FIG. 2(f')) by means of an etching mask (for instance, a photo-resist mask not shown) having a third pattern,
 etching the parts of the insulation film 23' which parts are not covered by the remaining polycrystalline semiconductor film 25 by utilizing the latter as an etching mask (result: FIG. 2(g)),
 diffusing an impurity into the semiconductor substrate 21 through windows (e.g. 27, 28) formed in the insulation film 23 by the etchings (of f' and g) to form diffused regions (e.g. 29, 30 in FIG. 2(h)),
 forming oxide films (e.g. 31, 31' of FIG. 2(i)) in the windows 27, 28 so as to cover side surfaces of the polycrystalline semiconductor films 25, 25' and 32,
 removing said oxidation-resistive films 26 remaining on the top faces of the polycrystalline semiconductor films 25, 25', 32, and
 selectively forming metal contacts (e.g. 37, 35, 36) on said top faces of the polycrystalline semiconductor films 25, 25', 32.

Figure 3:
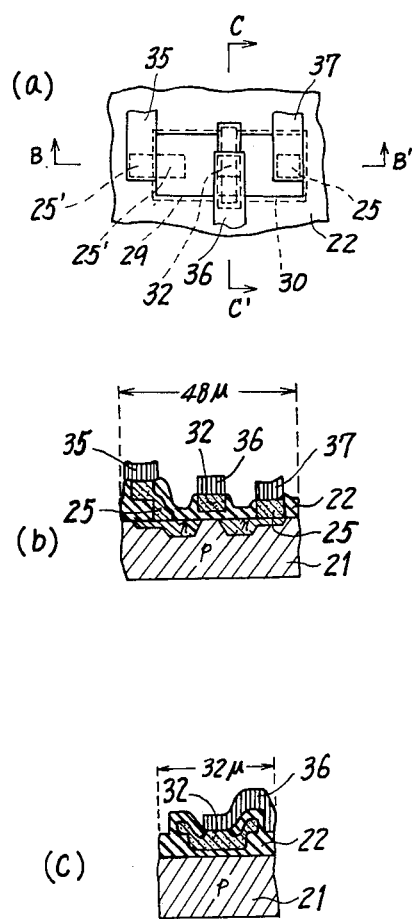
FIG. 3 shows the MOS transistor made by the steps shown in FIG. 2, wherein (a) is a planview, (b) is a sectional front view seen at the sectional plane indicated by the line B–B' in (a), and (c) is a sectional sideview seen at the sectional plane indicated by the line C–C' in (a)

A first example of the present invention is explained referring to FIG. 2 and FIG. 3, which illustrates manufacturing steps of an n-channel silicon-gate MOS transistor. First, on a p-type silicon substrate 21, silicon dioxide film 22 of about 1μ thick is formed, and then the film 22 is selectively etched by a known photo-etching method so as to remove the part other than those which later become field regions (FIG. 2(b)). On the surface of the silicon substrate 21 exposed from the opening formed by the abovementioned etching, a thin silicon dioxide film 23', which later becomes a gate oxide film 23, is formed with the thickness of about 1,000A by a known thermal oxidizing method (FIG. 2(b)).

Next, by means of a known photoetching process, windows 24, 24' are formed in the thin silicon dioxide film 23 retaining a selected part 23' which is a broader than the future gate region (FIG. 2(c)).

Then a highly-doped n-type polycrystalline silicon film 25 of about 5,000A thick is grown on the wafer by, for instance, thermal decomposition from $SiH_4$ or $SiCl_4$ together with phosphorus as the donor source (FIG. 2(d)). In the growing process, according to conditions, a single crystalline film may grow, but it is also acceptable to use a polycrystalline film since both polycrystalline and single crystalline silicon has the same effect. The polycrystalline silicon film 25 is so formed as having an impurity concentration of $10^{19} - 10^{21}$ atoms/Cm$^3$, hence low-resistance, in order to attain good electric conduction from the metal contact therewith to the diffused regions. The doping may be made by any known method after forming the polycrystalline silicon film 25.

Then, an oxidation-resistive film such as a silicon nitride ($Si_3N_4$) film 26 is formed with the thickness of about 500A by a known chemical vapor deposition method by utilizing a gas flow of $SiH_4$ and $NH_3$ (FIG. 2(e)).

The silicon nitride film 26 is then selectively etched away by a known method using phosphoric acid and a CVD—oxide mask made by a photo-etching process (FIG. 2(f)). The remaining pattern of the silicon nitride film 26 is made in a manner such that, in the direction perpendicular to the sheet of FIG. 2, the size of the contact hole in the film 26 is exactly the same with the designed finished size of the contact part, and in the horizontal direction on the sheet of FIG. 2, the size of the contact hole is made a little larger than the designed finished size of the contact part.

Next, by the photo-etching process, the silicon nitride film 26 and the polycrystalline film 25 are selectively etched away so as to form partial windows 27' and 28' (FIG. 2(f')). In this etching, when a plasma etching process employing $CF_4$ is used, both the silicon nitride film 26 and the polycrystalline silicon films 25 are etched by a continuous process. Alternatively, sequential etching, i.e., a etching of the silicon nitride film 26 with phosphoric acid followed by another etching of the polycrystalline silicon film 25 with an etching agent containing hydrofluoric acid and nitric acid may be made.

Then, by utilizing the remaining polycrystalline silicon film 25', 32 and 25 as the etching masks, the outer parts of the thin silicon dioxide mask 23', which parts are exposed in the partial windows 27' and 28', is etched away (FIG. 2(g)) to form complete windows 27 and 28.

From the windows 27 and 28, a donor, for instance phosphorus, is doped to form n-type source region 29 and drain region 30 (FIG. 2(h)). In this diffusion, the donor from the polycrystalline films 25' and 25 also diffuses into the substrate 21, and accordingly, the source region 29 and the drain region 30 are formed.

Then known thermal oxidation is carried out so as to form silicon oxide films 31' and 31 on the exposed surfaces of the crystalline silicon films 25', 32 and 25 and windows 27 and 28 (FIG. 2(i)). The top faces of the polycrystalline silicon films 25', 32 and 25 are covered by the remaining silicon nitride films 26, and accordingly, no silicon oxide films are formed on said top faces. The thickness of the resultant silicon dioxide films 31' and 31 should be about 2,000A, in order to retain most of the polycrystalline silicon films 25', 32 and 25 unoxidized.

Then, after removing the remaining silicon nitride films 26 using phosphoric acid (FIG. 2(j)) together with the oxidized surface layer thereof (not shown in the drawing), a metal film 34 of, for instance, Al, Ti, Pt or Mo is evaporated on the wafer (FIG. 2(k)). By a known photoetching process the metal film 34 is selectively etched to form metal contacts 35, 36 and 37 which contact top faces of the polycrystalline silicon films 25', 32 and 25, respectively (FIG. 2(l)).

If an IC-E/D-MOS invertor (a logic inverter comprising a enhancement-mode MOS transistor and an depletion mode MOS transistor) is formed with the present devices, the MOS transistor necessitates controlling the threshold voltage $V_T$. In such a case, an ion-implantation method may be used to implant an impurity to a desired place for the controlling.

In the abovementioned process of FIG. 2, after the step of FIG. 2(c), high temperature treatments are made only in the steps of thermal diffusion step (h) and in the forming of silicon dioxide film (i), and therefore, there is no disadvantage in thermal treatment in comparison with the conventional method of making the silicon gate MOS transistor or the IC.

Additional metal connection films (not shown in the drawing) can be made on the silicon dioxide film 31'.

The present invention can be applied also to the MOS IC wherein the connecting metal film strips cross over the polycrystalline silicon film strips with the insulation film inbetween.

Figure 4:
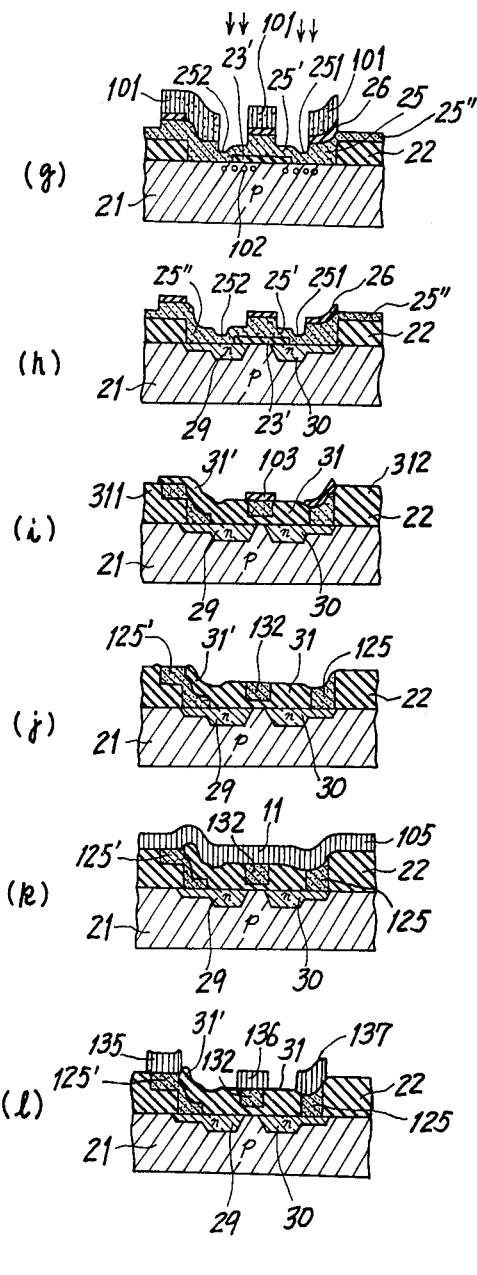
FIG. 4 shows by sectional front views conducting the steps of a second example, forming a second MOS transistor, embodying the present invention.
Figure 4:
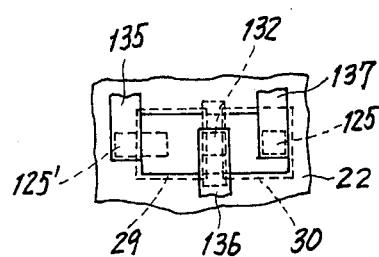

A second example, a second MOS transistor, is described referring to FIG. 4. In this process, steps (a) to (f) are similar to the steps described referring to FIG. 2(a) to (f), but the polycrystalline silicon film is made 3,000A thick. As a consequence, in FIG. 4, steps (a) to (f) are omitted and the subsequent steps (g) to (l) only are shown.

After the step of FIG. 2(f), a photoresist film 101 with a specified pattern is formed on the silicon nitride film 26 and the polycrystalline silicon film 25. By utilizing the photoresist film 101 as an etching mask, selected parts, which are not covered by the photoresist film 101, of the silicon nitride film are etched away, and subsequently the underlying polycrystalline silicon film 25 is also etched. The etching of the polycrystalline silicon film 25 is done in a manner such that the thickness of the polycrystalline silicon film becomes about one-half of the original thickness (FIG. 4(g)). Also, in this etching, when a plasma etching process employing $CF_4$ is used, both the silicon nitride film 26 and the polycrystalline film 25 are etched away by a continuous process. Alternatively, sequential etching, i.e., etching of the silicon nitride film 26 with phosphoric acid followed by another etching of the polycrystalline silicon film 25 with an etching agent containing hydrofluoric acid and nitric acid may be made.

Then, by a known ion-implantation method, phosphorus ions 102 are implanted through the thin parts of the polycrystalline silicon film 25' and the side end parts of the gate oxide film 23', thereby forming source and drain regions (FIG. 4(g)). The ion-implantation is so controlled that the ions are implanted only to the source and drain regions, but the ions are not implanted through the field parts or gate parts where the polycrystalline silicon film 25 is thick or/and the field oxide film 22 exists. The photoresist film 101 also serves to prevent ion-implantation therethrough into undesirable regions.

The abovementioned control of the ion implantation is made as follows:

Now, fo simplifying the explanation, it is provided that the ratio of the ranges of the ion implantation into the single crystalline silicon (of the substrate), into polycrystalline silicon, into silicon dioxide and into photoresist film is 1:1:1:2. Then, concerning the implantation range, the photoresist film corresponds to the silicon film or silicon oxide film of about half the thickness of the former. Now, the thickness of the films are set as follows:

| | |
|---|---|
| photoresist film 101 | 10,000Å |
| thicker parts of the polycrystalline silicon film 25 | 3,000A |
| thinner parts of the polycrystalline silicon film 251, 252 | 1,500Å |
| gate oxide film 23' | 1,000Å |
| field oxide film 22 | 10,000Å. |

Accordingly, at the parts of the source region and the drain region, the ion implantation is made through 1,500A of the thinner parts of polycrystalline silicon film 25 and 1,000A thick gate oxide film 23', the total thickness of which was converted into that of the silicon, i.e., an equivalent thickness is about 2,500A. In order to implant phosphorous ions through the films of the converted thickness of about 2,500A of silicon, ions accelerated by 200 KeV suffice. At the part of the field oxide film 22, the ion implantation is made through the thinner polycrystalline film of 1,500A in thickness and the field oxide film 22 of 10,000A in thickness, the equivalent thickness of them being about 11,500A. At the part of the gate oxide film 23', the implantation is made through the photoresist film 101 of 10,000A, with the thicker polycrystalline silicon film of 3,000A and gate oxide film of 1,000A, the equivalent thickness of them in total being about 9,000A. The abovementioned equivalent thicknesses of 11,500A for the field oxide film part and 9,000A for gate oxide film part, are sufficiently greater than the implantation range for the 200 KeV-accelerated ions. Accordingly, in these parts, these films can serve as an ion implantation mask, thereby limiting the ion-implanted regions 102 only to the drain regions and the source regions.

Next, annealing and diffusion of the implanted phosphor ions and thermal diffusion of donor from the n+-type polycrystalline silicon film 25 into the substrate region 21 are made to form the n-type source region 29 and the n-type drain region 30 (FIG. 4(h)). This annealing and thermal diffusion process may be done using the oxidation process described below.

Then, the oxidation process is made to form thermal oxidation film 31 and 31' on the exposed parts of the polycrystalline silicon films (FIG. 4(i)). As a result of the oxidation, about half of the thickness from the surface of the polycrystalline silicon films, namely, the parts of 1,500A thick from the surface, are oxidized thereby forming silicon dioxide films of about 3,000A thick. Generally, the resultant silicon dioxide film is twice as thick as that of the initial Si film.

Thus, the surface of the resultant silicon dioxide film surrounding the gate region becomes almost flush with the lower face of the silicon nitride film 103 on the gate region, i.e., the upper face of the polycrystalline silicon film 103 of the gate region.

Then after removing the remaining silicon nitride films 26 (FIG. 4(j)) together with the oxidized surface layer thereon (not shown in the drawing), a metal film 105 of, for instance Al, Ti, Pt or Mo is evaporated on the wafer (FIG. 4(k)). By known photoetching process, the metal film 105 is selectively etched to form metal contacts 135, 136 and 137 which contact top faces of the polycrystalline silicon films 125', 132 and 125, respectively (FIG. 4(l,m)).

Figure 5:
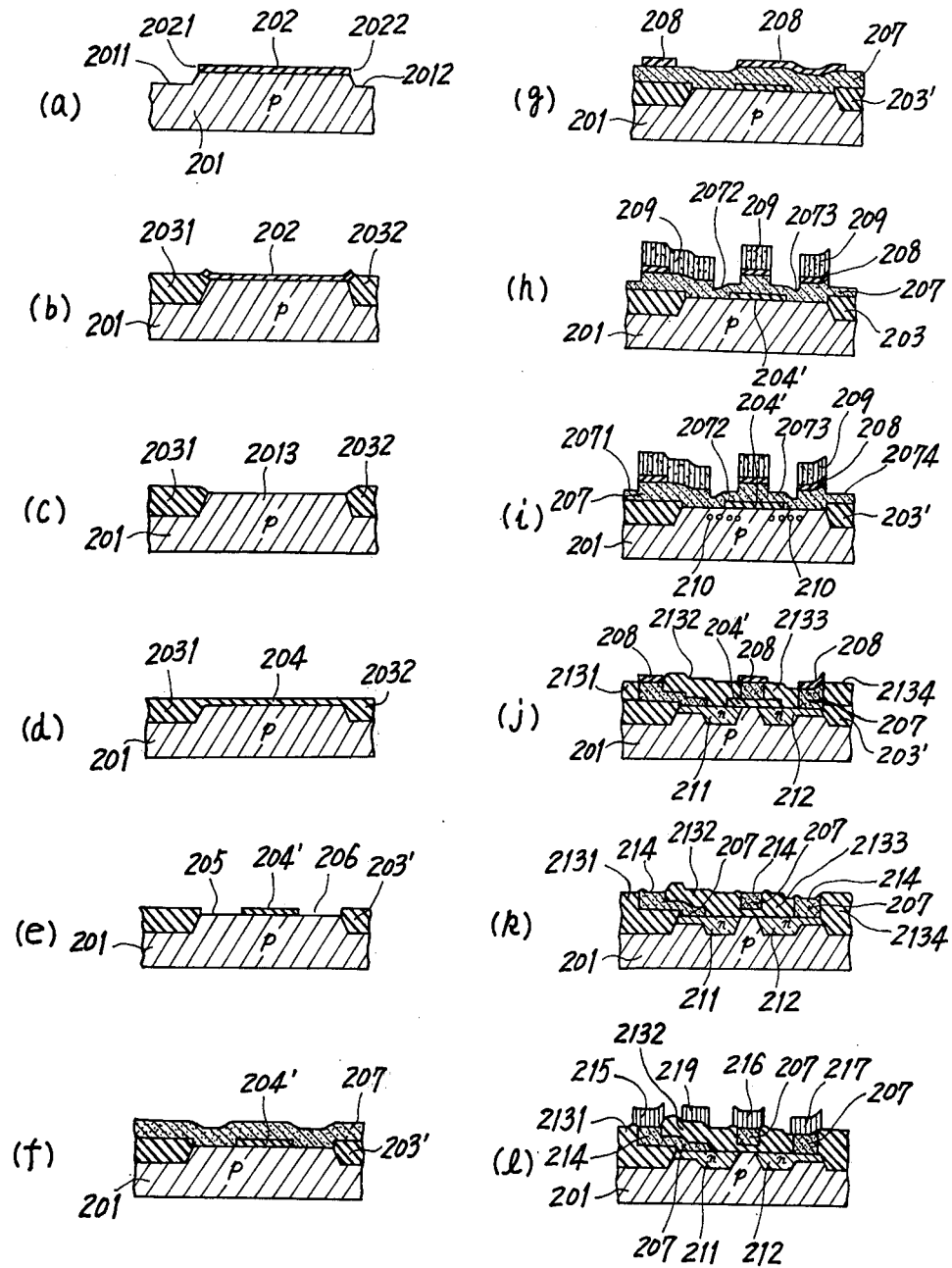
FIG. 5 shows by sectional front views conducting the steps of a third example, forming a third MOS transistor, embodying the present invention.

A third example, i.e., a third MOS transistor, is described referring to FIG. 5. In this example, the levels of the top faces of the polycrystalline silicon films, on which top faces the metal contacts are formed, can be made considerably uniform.

First, on a principal face of a p-type silicon substrate 201, a silicon nitride film 202 about 1,500A thick is formed. Subsequently, by a known photoetching process, on the part of the silicon nitride film, which part is later made, field parts are removed to form openings 2021 and 2022 in the silicon nitride film 202. Then, by utilizing the silicon nitride film 202 as an etching mask, the exposed surface of the silicon substrate 201 is etched to form recesses 2011 and 2012 of about 5,000A in depth (FIG. 5(a)).

Next, by oxidizing the surfaces of the recesses 2011 and 2012 in wet $O_2$ gas, thick $SiO_2$ films 2031 and 2032 are formed having a thickness of 10,000A. Since the oxidation of silicon forms a $SiO_2$ film twice as thick as that of the oxidized silicon layer, the surface of the resultant $SiO_2$ film 2031 and 2032 becomes roughly flush with that of the silicon nitride film 202 (FIG. 5(b)).

Then the silicon nitride film 202 is removed (FIG. 5(c)).

Next, the substrate surface 2013 exposed by removing of the silicon nitride film 202 is oxidized to form the $SiO_2$ gate film 204, in a manner that its surface is substantially flush with that of the field oxide films 2031 and 2032 (FIG. 5(d)).

Then, by a photoetching process, openings 205 and 206 in the $SiO_2$ film 204 are formed in the parts where the source contact and the drain contact are formed (FIG. 5(e)). In the etching, the gate film 204' should be retained in the size larger than that of the finally completed gate.

Next, on all over the upper surface of the wafer, a phosphorus-doped polycrystalline silicon film 207 is formed by known thermal decomposition method with the thickness of about 3,000A (FIG. 5(f)).

Silicon nitride films 208 of about 500A thickness are formed with a predetermined pattern (FIG. 5(g)), wherein in the direction perpendicular to the sheet of FIG. 5, the size of the contact hole in the film 208 is exactly the same with the designed finished size of the contact part, and in the horizontal direction on the sheet of FIG. 5, the size of the contact hole is made a little larger than the designed finished size of the contact part.

Then, photoresist films 209 of a predetermined pattern is formed on the wafer, and by utilizing the photoresist film 209 as etching masks, the silicon nitride films 208, and subsequently the underlying polycrystalline silicon film 207, are selectively etched in a manner that the etched part of the polycrystalline silicon films 207 are etched away to become about half of the initial thickness (FIG. 5(h)).

Subsequently, by means of a known ion-implantation method, phosphorus ions 210 are implanted into the substrate. The ion-implantation is made by appropriately selecting the ion-acceleration potential in relation with the thicknesses of the films, in a manner that the ions are selectively implanted only into the regions which will later be made the source regions and the drain regions (FIG. 5(i)). Subsequently, the photoresist films 209 are removed.

Then, annealing and diffusion of the implanted ions, and also impurity diffusion from n+-type polycrystalline silicon film 207 to the silicon substrate 201, are made by a thermal treatment, so that the n-type source region 211 and drain region 212 are formed (the source and drain regions are shown in FIG. 5(i)).

The abovementioned thermal treatment may be made as a part of the oxidation step described below.

If desired, a preliminary impurity diffusion may be made into the part scheduled to become the source and drain region on the substrate in order to form the source and drain regions.

Then, the exposed parts 2071, 2072, 2073 and 2074 of the polycrystalline silicon films are oxidized to form $SiO_2$ films 2131, 2132, 2133 and 2134, respectively. In the thinned parts 2072 and 2073, the oxidation is made up to the thickness of the polycrystalline silicon of that part (FIG. 5(j)).

Subsequently, the silicon nitride films 208 are removed to expose contacting faces 214 of the polycrystalline silicon films 207 (FIG. 5(k)). The other parts of the polycrystalline silicon films are covered by the $SiO_2$ films 2131, 2132, 2133 and 2134.

Contacting metal films, for instance Al films 215, 216 and 217 are disposed by, for instance, a vapor deposition method, onto the contacting faces 214 to form the source electrode, the gate electrode and the drain electrode, respectively. An additional metal contact 219 is disposed on the SiO film 2132 for interconnection between some electrodes of this or other devices on the same wafer (FIG. 5(l)).

A fourth example, a fourth MOS transistor, is described referring to FIGS. 5(a) to (k) and FIGS. 7(l) to (q). In this process, steps (a) to (k) are identical to the steps described referring to FIGS. 5(a) to (k). Hence, in FIG. 7 the steps (a) to (k) are omitted and the subsequent steps (l) to (q) only are shown.

After the step of FIG. 5(k), an n-type polycrystalline silicon film 225 is formed (FIG. 7(l)).

Then silicon nitride films 226 of a specified pattern are formed on the polycrystalline silicon film 225 (FIG. 7(m)), and photoresist films 228 of a specified pattern are formed on the wafer. By using the photoresist films 228 as etching mask, specified parts of the silicon nitride films 226 are etched away. Subsequently, specified parts of the surface of the polycrystalline silicon films 233 and 235 are etched away so as to lose half of their thickness (FIG. 7(n)).

Next, the photoresist films 228 are removed and the exposed parts of the polycrystalline films 233 and 235 are oxidized in a manner that the abovementioned thinned parts of the polycrystalline films are almost oxidized into $SiO_2$ up to their whole depth (FIG. 7(o)).

Then, the silicon nitride films 226 are removed (FIG. 7(p)), and metal contacts, for instance of Al films 230, 231 and 232, are disposed with a specified pattern, wherein the metal contact film 230 is for the source, the metal contact film 232 is for the drain and the metal contact film 231 is for the polycrystalline silicon film strip as an insulated conductor and the buried polycrystalline silicon region 227 is the gate electrode region (FIG. 7(q)), respectively.

With the abovementioned process, double decked conductors, namely lower conductor 227 and the upper conductor 225 can be made by utilizing the combined $SiO_2$ films 213 and 229.

By partly repeating the abovementioned processes, devices with triple decked conductors or quadruple decked conductors can be made.

A fifth example, a complementary MOS integrated circuit constituting an inverter circuit (which inverts polarity of signals) is elucidated referring to FIG. 8(a) to (n).

On an n-type silicon substrate 311, gate oxide films 312 of about 1,000A thickness and field oxide films 313 of about 10,000A thickness are disposed (FIG. 8(a)).

Then, a photoresist film 314 is selectively formed to cover the wafer surface except the area wherein a p-type well 315 will be formed (FIG. 8(b)).

Boron ions as acceptor are implanted through the exposed part of the SiO$_2$ gate film into the substrate 311 to form the p-type well region 315 by means of a known ion-implantation method. The abovementioned control of the ion implantation is made as follows:

Now, for simplifying the explanation, it is provided that the ratio of the ranges of the ion implantation into the single crystalline silicon (of the substrate), into polycrystalline silicon, into silicon dioxide and into photoresist film is 1:1:1:2. Then, concerning the implantation range, the photoresist film corresponds to the silicon film or silicon oxide film of about half the thickness of the former. The thicknesses of the films are set as follows:

| photoresist film 314 | 10,000A |
|---|---|
| gate film 312 | 1,000A. |

Since the boron ions accelerated by 30 KeV electric field have the implantation range of about 1,000A, the 10,000A thick photoresist film 314, which corresponds to 5,000A thick SiO$_2$ film with respect to the ion implantation range, can work as a mask in the ion implantation.

Next, annealing and diffusion of the implanted boron ions are made to form the p-type well 315 (FIG. 8(c)).

The order of the boron implantation followed by the annealing and diffusion and of forming the gate SiO$_2$ film 312 on the wafer surface can be inverted.

Then, by a known photo-etching process, the openings 316, 317, 318 and 319, for the source and drain contacts are formed (FIG. 8(d)). In this etching, gate oxide films 320 and 321 are formed to be greater than the size of finished gates.

Over all of the top face of the wafer, a polycrystalline silicon film 322 of 3,000A thick is formed (FIG. 8(e)).

Then, phosphorus-doped silicon dioxide film 323 is formed on the polycrystalline silicon film 321 by chemical vapor deposition, and by a known photoetching method, a specified part of the phosphorus-doped silicon dioxide film 323 is etched away to expose the polycrystalline silicon film 322 of the left half part where an n-channel MOS transistor is formed (FIG. 8(f)).

Subsequently, boron is diffused into the exposed polycrystalline silicon film 322, thereby giving the sheet resistance of about 200Ω/Cm$^2$. Further, the boron diffuses into the substrate 311 thereby forming p-type regions 326 and 327 which are defined by the gate oxide film 320. In this diffusion process, the phosphorus-doped silicon dioxide film 323 works as a shielding mask against the boron diffusion into the right half portion. Furthermore, the phosphorus impurity contained in the phosphorus-doped silicon dioxide film 323 diffuses into the polycrystalline silicon film under the phosphorus-doped silicon dioxide film 323.

As a result of the phosphorus-diffusion, the polycrystalline silicon film 322' above the p-type well acquires the low sheet resistivity of about 200Ω/Cm$^2$. The phosphorus impurity contained in the silicon dioxide film 323 further diffuses into the p-type well 315 to form n-type regions 324 and 325 with a specified pattern which is defined by the gate oxide film 321. (FIG. 8(g)).

Next, the phosphorus-doped silicon dioxide film 323 is removed, and over all of the top face of the wafer an oxidation-resistive silicon nitride film 328 is formed with a thickness of about 500A by a known method, and by means of a known photoetching method, the silicon nitride film 328 is etched to obtain a specified pattern (FIG. 8(h)).

Then photoresist films 329, 330 and 331 are formed on the wafer in a manner such that openings are made on the left part of the wafer (FIG. 8(i)). By utilizing these photoresist films as an etching mask, the silicon nitride film 328 is selectively etched, and subsequently, etching is made to etch the upper half portion of the exposed part of the polycrystalline silicon film 322 (FIG. 8(i)).

In the etching, the silicon nitride film 328 retained in the step of FIG. 8(h) is made a little larger than its finished size so as thereafter to be finished to a designed size by utilizing the photoresist films.

Then by means of the ion-implantation method, boron ions 335 are implanted into the substrate at such parts as are underneath the etched thin parts 332 and 333 of the polycrystalline silicon film (FIG. 8(j)).

Next, the photoresist films 329, 330 and 331 are removed and other photoresist films 336, 337 and 338 of a specified pattern are formed in a manner to have openings of a specified pattern in the right side. By utilizing these second photoresist films as an etching mask, the silicon nitride film 328 at the right part is selectively etched. Subsequently, another etching is made to etch the upper half depth part of the exposed part of the polycrystalline silicon film 322 (FIG. 8(k)).

Then, by means of the ion implantation method, phosphorus ions 341 are implanted into the substrate at such parts as are underneath the etched thin parts 339 and 340 of the polycrystalline silicon film (FIG. 8(k)).

The abovementioned implanted ions, i.e., boron ions 335 and phosphorus ions 341 are annealed and diffused by a heat treatment. However, such heat treatment can be made simultaneously with the subsequent oxidation process.

Then, all the photoresist films are removed and the oxidation is made so as to oxidize the exposed, thinned parts 339 and 340 of the polycrystalline films (FIG. 8(l)).

Silicon nitride film 328 together with oxidized film on the surface thereof are removed to expose the polycrystalline silicon surfaces (FIG. 8(m)).

Then, aluminum contact film is vapor-deposited on the top face of the wafer, and subsequently, by means of photoetching process, an etching mask is formed. By utilizing the etching mask, the metal contact film is etched to form the source contacts 351 and 352, drain contact 353, gate contacts 354 and 355 and an isolated line 356 (FIG. 8(n)). Thus, a signal inverter circuit comprising a p-type/n-type complementary MOS FETs is formed. In FIG. 8(n), 360 and 361 designated source electrode regions, 362 and 363 designate drain electrode regions, and 364 and 365 designate gate electrode regions, respectively.

As is described in the above, according to the present invention, the mask, which is used, for instance, in the FIG. 2(f) step for defining the pattern of Si$_3$N$_4$ film 26, further defines the pattern of the gate oxide film in the FIG. 2(g) step, and further defines the pattern of the impurity diffused regions 29 and 30 together with the pattern of the retained polycrystalline regions 25', 32 and 25, which later become source gate and drain electrode regions. Therefore, the relationship of the positions between the channel regions and the three electrodes are automatically correctly alligned.

Furthermore, since the full area of the contacting top faces of the polycrystalline Si film, for instance 25, 32 and 25', can be exposed by removal of the Si$_3$N$_4$ films 26 in the FIG. 2(j) step, contact of the metal film to the polycrystalline Si can be made easily without any need of opening contacting windows by utilizing a mask as necessitated in the prior art. Therefore, there is no need for designing a very broad contacting metal strip in order to secure allowance for possible misplacement of the mask registration. Accordingly, the size of the device can be made so small that the ratio of the area of the device of Example of FIGS. 3 or 6 to that of FIG. 1 is 1635$\mu^2$/2912$\mu^2$ = 52.7%.

According to the present invention, forming of the contacting opening is made by removal of the Si$_3$N$_4$ films in the FIG. 2(j), FIG. 4(j), FIG. 5(k) FIG. 7(p), or the FIG. 8(m) step, and the removal agent for the Si$_3$N$_4$ does not form undesirable pin-holes in the SiO$_2$ film. Therefore, there is no fear that pin holes in the SiO$_2$ film may cause undesirable shortcircuiting in the device by vapor-deposited metals in the pin-holes. Furthermore, the contacts to polycrystalline Si are made onto fully opened top faces of the polycrystalline Si films, and no SiO$_2$ window fringes lie inbetween. Accordingly, the contacting face of the metal contacts have only small level differences from each other.

In the present device, top faces of the polycrystalline silicon films, i.e., the top face of the polycrystalline silicon film, to which a metal electrode is connected, and the top face of the polycrystalline silicon film, which is buried in the SiO$_2$ film, hence isolated from other conductive parts, can be made considerably in a similar level with each other and with the faces of the silicon dioxide film, contrasted by the prior art of FIG. 1 having a considerable level difference. Accordingly, forming metal contacting films on the device can safely be made without the wasteful allowance in sizes of the metal contacts.

Furthermore, in the field parts, the oxide film comprises initially formed field films (for instance 22 of FIG. 4) and additional films formed by oxidation of the polycrystalline silicon film on that part. Accordingly, the oxide film is thick, thereby enabling decreasing of parasitic MOS operation or parasitic capacities.

As has been described in the above, the present invention purports to increase the integration density by means of a decrease of the contact area realized by the new fine registration method of forming the contacting opening through removal of the Si$_3$N$_4$ film and another decrease realized by the decrease of the aforementioned level difference.

What I claim is:

1. A method of making an integrated circuit semiconductor device comprising the successive steps of:
    a. providing a semiconductor substrate material of a first conductivity type,
    b. forming an insulation film having thinner parts, thicker parts and openings on a principle face of said semiconductor substrate,
    c. depositing a low-resistance semiconductor film on both the insulation film and openings,
    d. depositing an oxidation-resistant film on said low-resistance semiconductor film,
    e. forming a plurality of retained regions of said low-resistance semiconductor film by at least thinning the low-resistance semiconductor regions surrounding said retained regions, said retained regions being at least partly covered by said oxidation resistant film,
    f. introducing at least one impurity of a second conductivity type material into selected portions of the substrate region utilizing said retained regions of step (c) as a mask,
    g. oxidizing selected parts of the low-resistance semiconductor film by utilizing said oxidation-resistant film as a mask to form an insulation film,
    h. removing said oxidation-resistant film, thereby exposing a surface of said low-resistance semiconductor film, and
    i. forming metal contact films of a predetermined pattern on said exposed surface of said low-resistance semiconductor film.

2. The method of claim 1, wherein the retained regions of step (c) are formed by:
    1. forming a plurality of said oxidation-resistive film regions having a first pattern,
    2. forming an etchant resistant mask having a second pattern, and
    3. etching selected parts of said plurality of oxidation-resistant film regions such as to at least thin said low-resistant semiconductor film, utilizing said etchant resistive mask.

3. The method of claim 1, wherein the impurity is introduced by ion implantation.

4. The method of claim 1, wherein said oxidation-resistant film is silicon nitride film and the low-resistive semiconductor film is polycrystalline silicon film.

5. The method of claim 1, wherein a predetermined part of said retained regions is surrounded by and isolated from said substrate by said insulation film thereby forming the gate region, and other predetermined parts of said retained regions are formed on a predetermined portion of said semiconductor substrate exposed from said openings to form the source and the drain region.

6. The method of claim 1, wherein step (c) comprises successive deposition steps of an impurity doped semiconductor film.

7. The method of claim 1, wherein step (c) comprises the successive steps of;
    1. depositing a semiconductor film on said insulation film and said openings,
    2. introducing one impurity of a second conductivity type into said semiconductor film by impurity diffusion.

* * * * *